United States Patent [19]

Sato

[11] Patent Number: 5,101,324
[45] Date of Patent: Mar. 31, 1992

[54] STRUCTURE, METHOD OF, AND APPARATUS FOR MOUNTING SEMICONDUCTOR DEVICES

[75] Inventor: Eiichi Sato, Suwa, Japan

[73] Assignee: Seiko Epson Corporation, Tokyo, Japan

[21] Appl. No.: 486,430

[22] Filed: Feb. 28, 1990

[30] Foreign Application Priority Data

Mar. 2, 1989 [JP] Japan .................................. 1-65879
Nov. 24, 1989 [JP] Japan ................................ 1-303152

[51] Int. Cl.⁵ ............................................. H05K 7/02
[52] U.S. Cl. ................................ 361/400; 361/417; 174/52.2; 357/72
[58] Field of Search ............... 361/398, 400, 402, 404, 361/405, 406, 408, 417, 419, 420; 174/52.2, 52.3, 52.4; 357/70, 72

[56] References Cited

U.S. PATENT DOCUMENTS

| | | | |
|---|---|---|---|
| 3,395,318 | 7/1968 | Laermer et al. | 361/404 |
| 4,079,511 | 3/1978 | Grabbe | 174/42.2 X |
| 4,423,468 | 12/1983 | Gatto et al. | 361/404 |
| 4,933,810 | 7/1990 | Cardashian et al. | 361/398 |

FOREIGN PATENT DOCUMENTS 0144872  11/1979  Japan ..................................... 357/70

*Primary Examiner*—Gerald P. Tolin
*Assistant Examiner*—Paramita Ghosh
*Attorney, Agent, or Firm*—Spensley Horn Jubas & Lubitz

[57] ABSTRACT

Semiconductor devices are each arranged such that a semiconductor chip is disposed on a film carrier, fingers of the film carrier are respectively connected to a multiplicity of electrodes provided on the semiconductor chip, and the fingers are then trimmed, or the fingers are trimmed after the semiconductor chip and parts of the fingers are sealed with a resin or the like. The semiconductor devices thus arranged are respectively mounted on both obverse and reverse surfaces of a substrate at mutually opposing positions thereof, the substrate having electrically conductive patterns formed on both surfaces thereof. The semiconductor devices are sealed with a resin or the like so as to be formed integrally with the substrate.

5 Claims, 5 Drawing Sheets

STRUCTURE, METHOD OF, AND APPARATUS FOR MOUNTING SEMICONDUCTOR DEVICES

BACKGROUND OF THE INVENTION

1. Field of the Invention

The present invention relates to the mounting of semiconductor devices using a film carrier.

2. Description of the Related Art

In general, semiconductor devices are manufactured by the following process: each semiconductor chip is mounted on a die pad provided on a lead frame; external electrodes of the semiconductor chip and the leads (terminals) of the lead frame are respectively connected to each other by means of a bonding wire; the assembly is packaged with a thermosetting resin such as epoxy resin; and the leads are trimmed.

In conjunction with the current trend toward thinner and more compact electronic units, with respect to semiconductor devices used in such units, efforts have been made to develop thin and compact semiconductor devices in order to realize the mounting of the semiconductor devices with a high mounting density. To meet this demand, semiconductor devices which have come to be used include semiconductor chips each disposed in a device hole of a film carrier, the electrodes of the semiconductor chip and the fingers of the film carrier are directly connected to each other, and this assembly is packaged with a sealing materials constituted by a liquid resin (e.g., epoxy resin) by printing or potting.

FIG. 7 is a top plan view illustrating a film carrier for semiconductor devices. A film carrier (hereinafter referred to as the film) 1 having a thickness of the order of 25-125 μm is provided with device holes 2, 2a, 2b, . . . , each having an area larger than the surface area of an associated semiconductor chip 6, 6a, 6b, . . . , which will be described later, device holes 2, 2a, 2b being arranged at uniform intervals in the longitudinal direction of film 1. A multiplicity of fingers 3 are constituted by a metallic foil made of a material, such as copper, having a high electric conductivity and having a thickness of about 10-70 μm and a width of about 30-300 μm. Fingers 3 are disposed on film 1 and each finger 3 has a free end which projects into the associated device hole 2, 2a, 2b. Sprocket holes 5 are used to convey film 1.

FIG. 8 is a schematic diagram illustrating an example of an apparatus for mounting semiconductor chips on the above-described film 1. In operation, semiconductor chip 6 mounted on a pair of chip bases 8 is brought to a defined position by a pair of positioning guides 9. Meanwhile, film 1 is fed by means of a pair of sprockets (not shown) while being guided by a pair of tape rails 10 in a direction in which semiconductor chip 6 is fed. Film 1 is then stopped at a position where chip 6 is positioned below associated device hole 2. Subsequently, a multiplicity of pads 4 provided on semiconductor chip 6 and fingers 3 are respectively aligned with each other. Then, a heated bonding tool 11 is lowered to press fingers 3, so that fingers 3 are bent into a predetermined angle and are fused to respective pads 4 and connected thereto. Film 1 is then moved, and fingers 3 are trimmed, or fingers 3 are trimmed after semiconductor chip 6 and parts of fingers 3 are sealed with a sealing resin by means of squeeze printing, potting, or other similar method, thereby manufacturing a semiconductor device D.

As shown in FIGS. 9 and 10, the semiconductor device D manufactured as described above is mounted on a printed circuit board 20 with its active surface facing printed circuit board 20. after fingers 3 are respectively soldered to a conductive pattern 21 formed on a surface of printed circuit board 20, peripheral surfaces of semiconductor chip 6 and fingers 3 are sealed with a resin 12 or the like by means of squeeze printing, potting, or other similar method.

The printed circuit board 20 with the above-described semiconductor device D mounted thereon has characteristics that the printed circuit board 20 can be made thinner than a conventional one, and that the degree of mounting density can be increased. However, if the semiconductor device D is sealed with resin 12 or the like, a phenomenon occurs in which the printed circuit board 20 is curved or warped such that the side where the semiconductor devices D are mounted, assumes a concave curvature due to shrinkage upon curing of resin 12 or the like. This condition is depicted in FIG. 11.

Consequently, there are cases where compression cracks occur in semiconductor chip 6. In addition, if the curved printed circuit board 20 is secured to a frame or the like, the curvature must be removed. At that time, however, fingers 3 sealed with resin 12 or the like can be cut off, and, hence, there have been problems that the production yield is low and that such products lack reliability.

Furthermore, although the technique described above is capable of enhancing the degree of mounting density as compared with the conventional art, there are limitations to this, and it is considered difficult to improve the degree of mounting density by a substantial level in the future.

SUMMARY OF THE INVENTION

Accordingly, an object of the present invention is to provide a structure for, a method of, and an apparatus for, mounting semiconductor devices which are capable of preventing the occurrence of curving or warping in a substrate at the time of mounting the semiconductor devices and of substantially improving the degree of mounting density, thereby overcoming the above-described drawbacks of the conventional art.

To this end, in accordance with one aspect of the invention, there is provided a structure for mounting semiconductor devices wherein a multiplicity of semiconductor devices are each arranged such that a semiconductor chip is disposed on a film carrier, fingers of the film carrier are respectively connected to a multiplicity of electrodes provided on the semiconductor chip, and the fingers are then trimmed, or the fingers are trimmed after the semiconductor chip and parts of the fingers are sealed with a resin or the like, wherein the semiconductor devices thus arranged are respectively mounted on both obverse and reverse surfaces of a substrate at mutually opposing positions thereof, the substrate having electrically conductive patterns formed on both surfaces thereof, and wherein the semiconductor devices are sealed with a resin or the like so as to be unified with the substrate.

In accordance with another aspect of the invention, there is provided a method of mounting semiconductor devices, comprising the steps of: preparing a multiplicity of semiconductor devices which are each arranged such that a semiconductor chip is disposed on a film carrier, fingers of the film carrier are respectively connected to a multiplicity of electrodes provided on the semiconductor chip, and the fingers are then trimmed, or the fingers are trimmed after the semiconductor chip and parts of the fingers are sealed with a resin or the like, and preparing a substrate having electrically conductive patterns formed on both surfaces thereof; mounting the semiconductor devices respectively on both surfaces of the substrate at mutually opposing positions thereof; and sealing the semiconductor devices with a resin or the like so as to form the semiconductor devices as a unit with the substrate.

In accordance with still another aspect of the invention, there is provided an apparatus for mounting semiconductor devices comprising: a base, a frame secured to the base; a work table which is mounted on the base in such a manner as to be moveable in the X-Y directions and to which a substrate is secured; and at least a pair of bonding tools disposed at opposite sides of the base frame and moveable at right angles to the substrate.

In operation, a necessary number of semiconductor devices are first secured to one surface of the substrate, the substrate is inverted, and further semiconductor devices are secured to the other surface in face-to-face relation with the semiconductor devices already mounted. Then, the semiconductor devices mounted on both surfaces of the substrate are respectively sealed with resin or the like, and the both sides are simultaneously heated to harden, thereby becoming formed as a unit with the substrate.

Alternatively, a semiconductor device is placed on the lower bonding tool, while another semiconductor device is mounted on the upper surface of the substrate. Then, the work table is moved so that the semiconductor device is aligned with the bonding tool. Subsequently, the upper bonding tool is lowered and the lower bonding tool raised so that the two semiconductor devices are respectively brought into contact with the obverse and reverse surfaces of the substrate. If the semiconductor devices are then subjected to pressurization and heating, the semiconductor devices can be connected to the substrate.

The above and other objects, features, and advantages of the present invention will become more apparent from the following detailed description of the invention when read in conjunction with the accompanying drawings.

DESCRIPTION OF THE PREFERRED EMBODIMENTS

Figure 1:
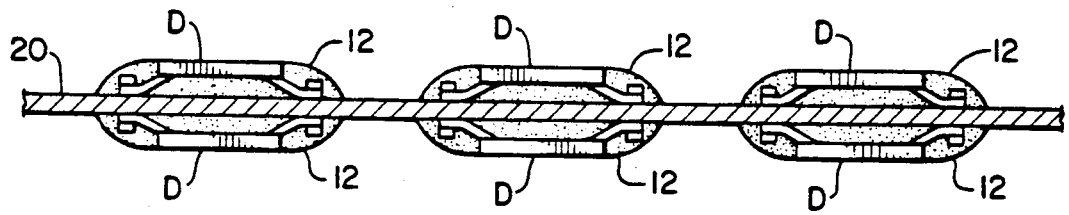
FIG. 1 is a cross-sectional view schematically illustrating an embodiment of the present invention.
Figure 2:
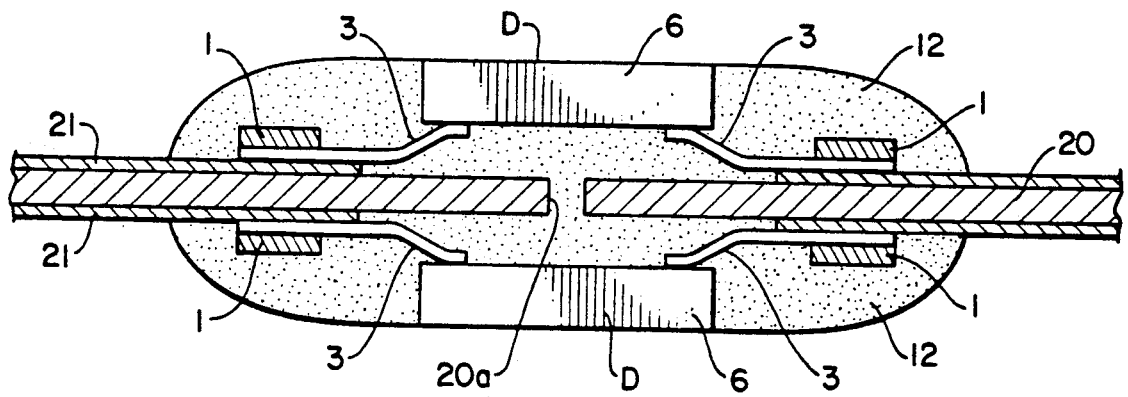
FIG. 2 is a cross-sectional detail view of the embodiment of FIG. 1.

FIG. 1 is a cross-sectional view schematically illustrating an embodiment of the present invention, and FIG. 2 is a partial enlarged detail view thereof. It should be noted that, in these drawings, those parts that are identical with or correspond to those of the conventional art shown in FIGS. 7-11 are denoted by the same reference numerals.

In the present invention, the assembling of relevant components is effected as follows: A substrate 20 is provided with electrically conductive patterns 21 on both sides thereof. A pair of semiconductor devices D are respectively disposed on both obverse and reverse surfaces of substrate 20, equidistant from substrate 20 in such a manner as to be disposed symmetrically with respect to substrate 20 and oppose each other with their active surfaces facing substrate 20. Then, after fingers 3 are connected to respective conductive patterns 21, the peripheral surfaces of semiconductor chips 6 and fingers 3 are sealed with a resin 12 or the like.

Figure 3A:
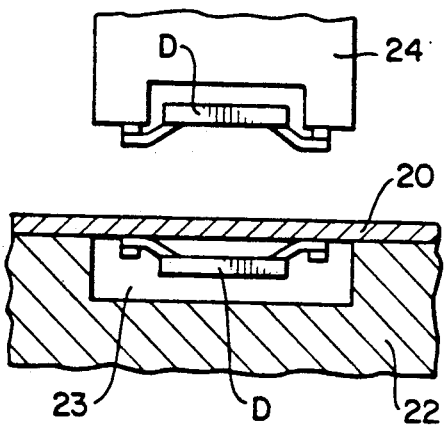
FIGS. 3a and 3b are diagrams illustrating an example of a method of mounting in accordance with the present invention.

A description will now be given of an example of the procedure of mounting in accordance with the present invention. Prior to the point in time depicted in FIG. 3A, one semiconductor device D is mounted on one side (e.g., the obverse surface) of substrate 20 using a bonding tool 24 for the semiconductor device D in such a manner that the active surface of the semiconductor device D faces substrate 20. At this time, fingers 3 and conductive pattern 21 to which solder has been applied are aligned with each other. Then fingers 3, or fingers 3 and a film 1, are pressed and heated by bonding tool 24, thereby allowing respective fingers 3 to be connected to conductive pattern 21. In this manner, all the necessary semiconductor devices D are mounted on the obverse surface of substrate 20.

Next, substrate 20 is inverted and is placed on a holding plate 22 provided with recesses 23 in correspondence with a mounting apparatus for mounting the semiconductor devices D, and the semiconductor devices D are positioned in the recesses 23, respectively. In this state, shown in FIG. 3a, in the same way as described above, each of the semiconductor devices D is mounted on the other side (reverse surface) of substrate 20 at a position of symmetry with a respective semiconductor device mounted on the obverse side and in opposing relation thereto.

Upon completion of the mounting of the semiconductor devices D, the peripheral surfaces of each of semiconductor chips 6 and fingers 3 (possibly including film 1) on the side concerned (reverse surface) of substrate 20 are first sealed with resin 12 or the like. Then, substrate 20 is again inverted, or rotated 180°, and the semiconductor devices D mounted on the opposite side (obverse surface) are sealed with resin 12 or the like in the same manner as described above. It should be noted that, in this case, if, as shown in FIG. 2, a through hole 20a is provided in substrate 20 immediately below each of semiconductor chips 6, and the upper and lower portions of resin 12 or the like are connected to each other through this through hole 20a, the sealing strength can be improved further.

Finally, substrate 20 with the semiconductor devices D mounted thereon and sealed is placed in a heating furnace of the like, and the seal portions on both surfaces are heated simultaneously to allow resin 12 or the like to be cured so as to be formed integrally with substrate 20.

Thus, in accordance with the present invention, since the semiconductor devices D are mounted on both surfaces of substrate 20 and are sealed with resin 12 or the like, and resin 12 or the like on both surfaces is cured simultaneously, the substrate 20 is prevented from becoming curved or warped due to shrinkage on curing.

Figure 3B:
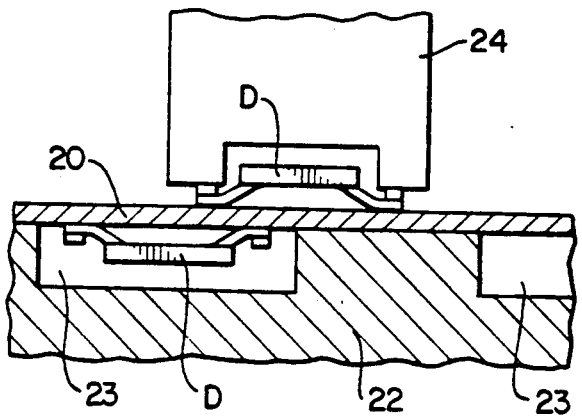

It should be noted that, if the semiconductor devices D are mounted on obverse and reverse sides of the substrate at positions which do not correspond to each other, as shown in FIG. 3b, an uneven stress would be applied to the semiconductor device D mounted on the opposite surface, so that a crack may occur in semiconductor chip 6 or fingers 3 may be cut, and this arrangement is therefore undesirable.

Figure 4:
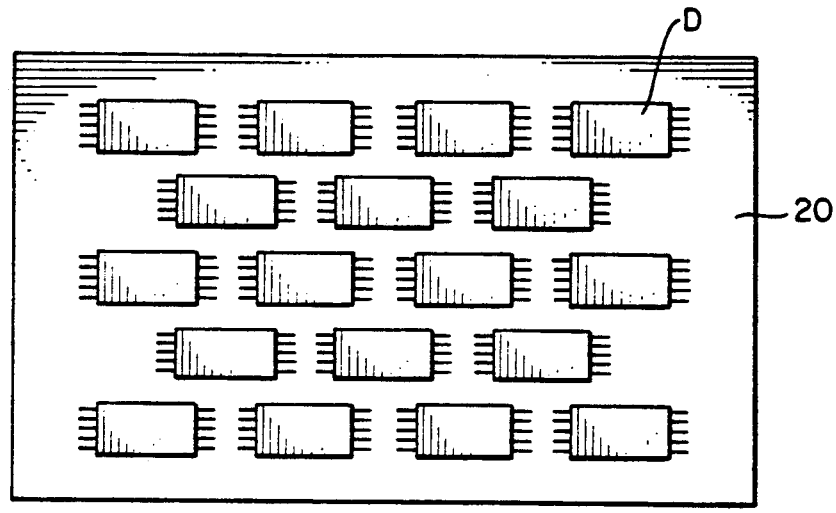
FIGS. 4 and 5 are top plan views respectively illustrating various embodiments of the present invention.

FIG. 4 is a top plan view illustrating one embodiment of a structure according to the present invention. In this embodiment, the semiconductor devices D are arranged in rows on both surfaces of substrate 20 in such a manner as to oppose each other in the thickness direction of substrate 20, the semiconductor devices in one row being offset from those in an adjacent row, i.e., arranged in a staggered manner. This arrangement not only permits the mounting of the semiconductor devices D at a greater density but improves the strength of substrate 20 by further preventing the curving or warping of substrate 20.

Figure 5:
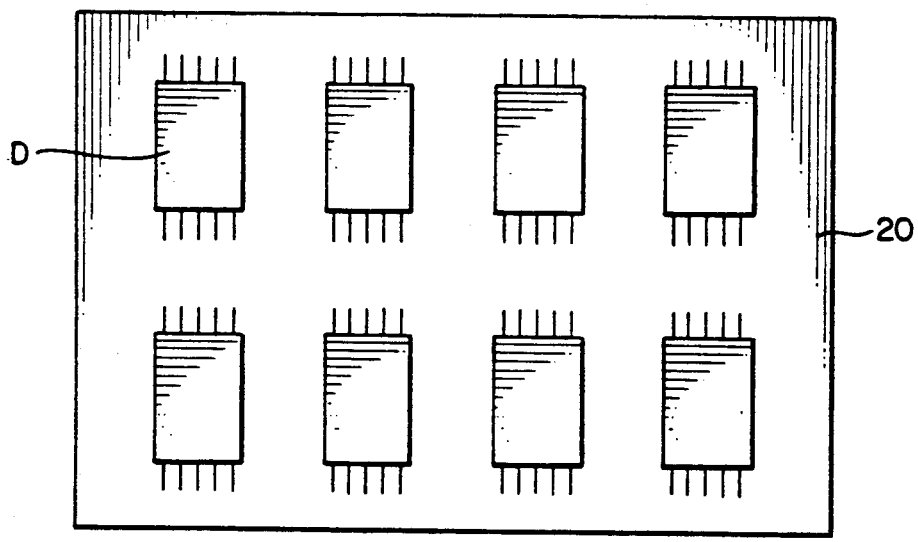

Furthermore, FIG. 5 illustrates still another embodiment of a structure according to the present invention in which the semiconductor devices D are arranged in rows on both sides of the substrate 20 in such a manner as to oppose each other in the thickness direction of substrate 20 such that the longitudinal direction of each of the semiconductor devices D, in which direction the semiconductor devices D are liable to undergo cure shrinkage, is made substantially parallel with the transverse direction of substrate 20, in which direction substrate 20 is less liable to curve or warp. This arrangement makes it possible to prevent the curving or warping of substrate 20 even when a multiplicity of semiconductor devices D are mounted thereon.

Figure 6:
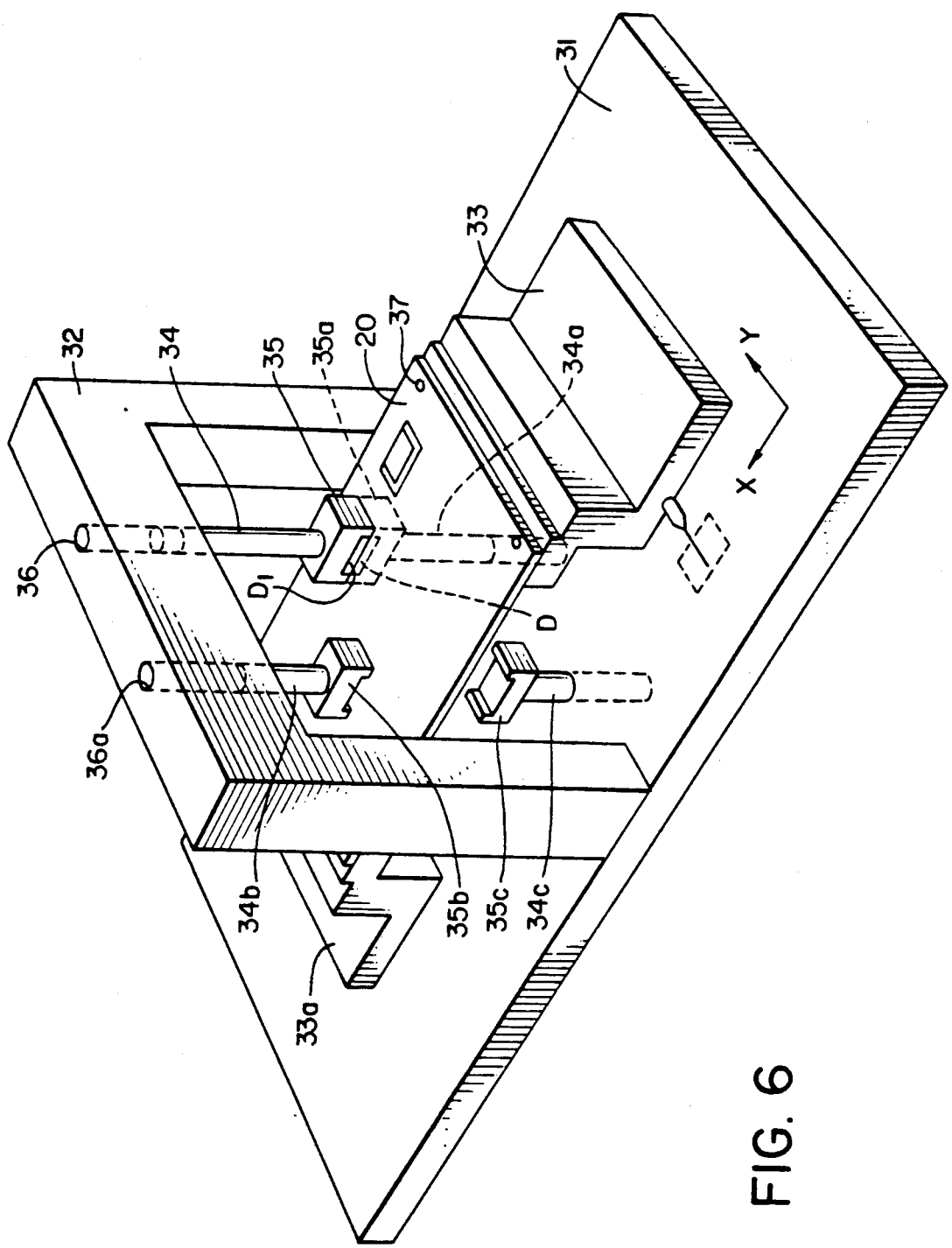
FIG. 6 is a perspective view of an apparatus for mounting semiconductor devices in accordance with the present invention.
Figure 7:
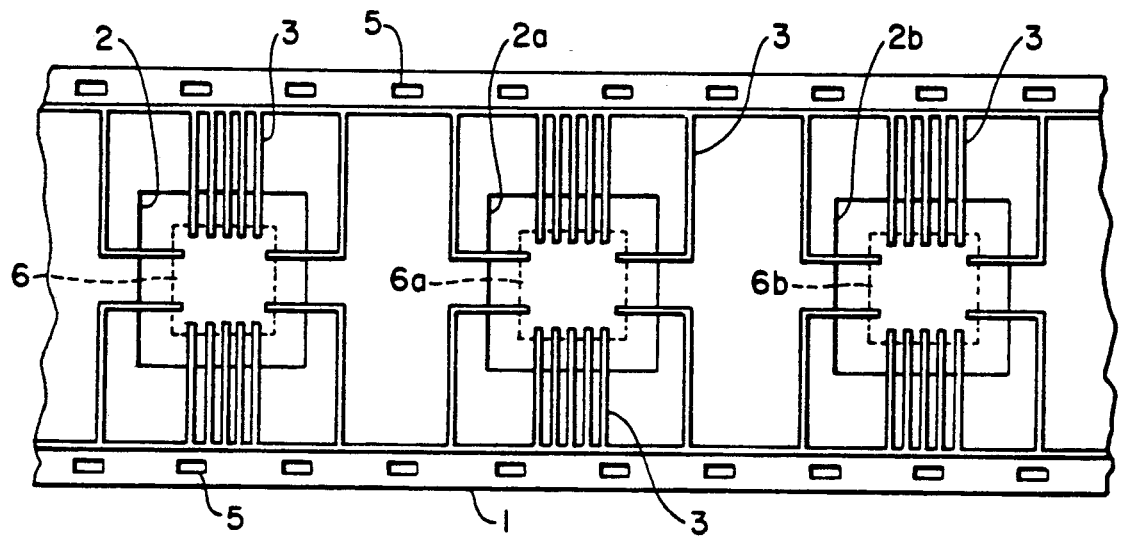
FIGS. 7 and 8 are diagrams illustrating a conventional example of manufacturing a semiconductor device using a film carrier.
Figure 8:
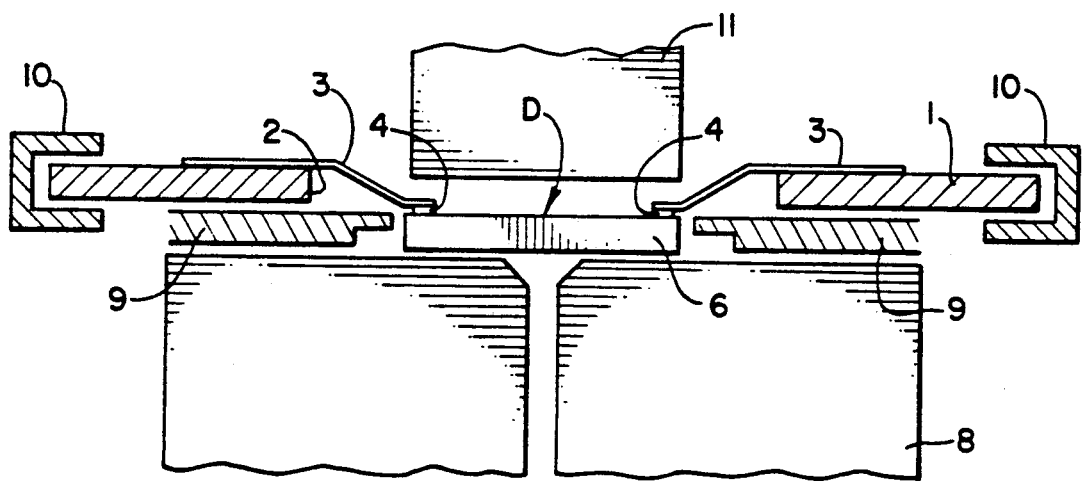
Figure 9:
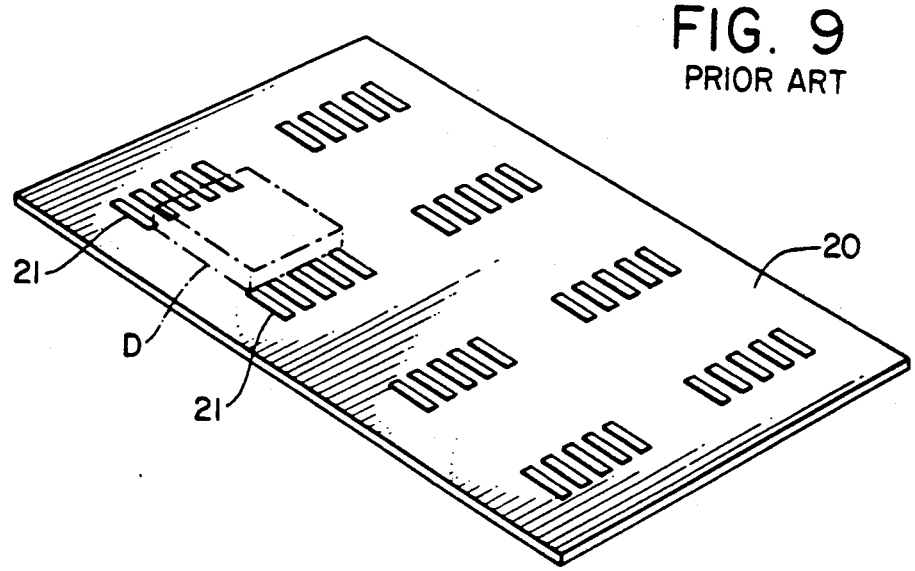
FIGS. 9, 10 and 11 are diagrams illustrating a conventional example of mounting semiconductor devices.
Figure 10:
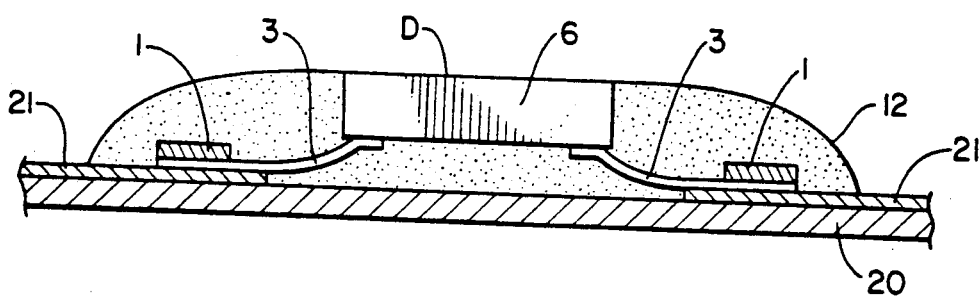
Figure 11:
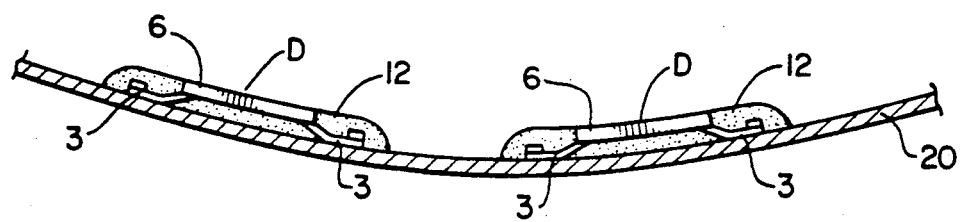

FIG. 6 is a perspective view of an embodiment of a mounting apparatus for semiconductors in accordance with the present invention. This mounting apparatus comprises the following components or portions: a base 31, a gate-type frame 32 provided on base 31; work tables 33, 33a mounted on the base 31 and capable of being moved across the base 31 in the X-Y directions by means of a motor, compressed air, or the like; a support rod 34 fitted vertically slidably in a bore 36 provided in gate-type frame 32, a support rod 34a which is fitted vertically slidably in a bore (not shown) provided in base 31 in face-to-face relation with the support rod 34; bonding tools 35, 35a fixed to the distal ends of the support rods 34, 34a, respectively, in face-to-face relation with one another and support rods 34b, 34c and bonding tools 35b, 35c arranged like components 34, 34a, 35 and 35a. Support rods 34-34c are displaced by compressed air, a rack and pinion, and the like (not shown) so as to move vertically through bores 36, 36a, etc.

A description will now be given of the operation of this apparatus arranged as described above. To facilitate the description, a case will be cited in which two semiconductor devices D, D$_1$ are respectively mounted on opposite sides of substrate 20, in such a manner as to oppose each other, by using bonding tools 35, 35a.

(1) Substrate 20 is secured on work tables 33, 33a by means of screws 37 or the like. At this juncture, bonding tools 35 to 35C are kept at their uppermost or lowermost positions, respectively, i.e., their positions remote from substrate 20.

(2) The semiconductor device D is placed on bonding tool 35a below substrate 20, while the other semiconductor device D$_1$ is placed on a conductive pattern (not illustrated) provided on the upper surface of substrate 20.

(3) Work tables 33, 33a, and hence substrate 20, are moved in the X-Y directions so as to align semiconductor device D$_1$ with bonding tool 35. At this time, since the bonding tools 35 and 35a are opposed to each other accurately, the position of the semiconductor device D mounted on bonding tool 35a and the position of the semiconductor device D$_1$ on substrate 20 are also aligned with each other accurately.

(4) Bonding tool 35a is raised to bring the terminals of the semiconductor device D into contact with the conductive pattern, and bonding tool 35 is lowered to be brought into contact with the semiconductor device D$_1$. As a result, the semiconductor devices, D, D$_1$ are clamped by and held between bonding tools 35, 35a with the substrate 20 as a center.

(5) In this state, if the terminals of the semiconductor devices D, D$_1$ are pressurized and heated by the bonding tools 35, 35a, the terminals are connected to the conductive pattern.

(6) When the connection of the semiconductor devices D, D$_1$ is completed, bonding tool 35 is raised and bonding tool 35a lowered, and further semiconductor devices are mounted in the manner described above.

Although, in the foregoing embodiment, a description has been given of a case in which the semiconductor devices D, D$_1$ are mounted by means of the pair of bonding tools 35, 35a, bonding may be effected by using the other pair of bonding tools 35b, 35c separately or simultaneously, or three or more pairs of bonding tools may be provided.

Thus, in accordance with the present apparatus, it is possible to effect the bonding of the semiconductor devices D simultaneously on both the obverse and reverse sides of substrate 20 with a simple structure, so that the time required for bonding can be reduced substantially.

In the foregoing embodiment, a description has been given of a case in which fingers 3 are trimmed and are connected to conductive pattern 21 of substrate 20, semiconductor chip 6 is secured to film 1, and the assembly is then provided with sealing with resin 12 or the like. However, an arrangement may be alternatively provided such that after semiconductor chip 6 is secured to film 1 and is sealed with the resin or the like, and the fingers are trimmed, the semiconductor devices in this state are respectively provided on both the obverse and reverse sides of substrate 20 and are further sealed with sealing resin 12 or the like.

In addition, although a description has been given of a case in which the semiconductor devices D are mounted with their active surfaces facing substrate 20, the semiconductor devices D may be mounted with their active surfaces oriented in directions away from substrate 20, respectively.

As is apparent from the foregoing description, in accordance with the present invention, the semiconductor devices are respectively secured to the opposite sides of the substrate at symmetrical positions thereof, and after the assembly is sealed with a resin or the like, both sides are heated to be cured, thereby becoming integral with the substrate. Accordingly, the cure shrinkage of the resin and the like is offset, so that the substrate is prevented from becoming curved or warped toward one side. In consequence, it is possible to prevent the semiconductor chips from becoming cracked and the fingers from becoming cut off, thereby making it possible to obtain a high quality, highly reliable product at a high rate of yield. Furthermore, since the semiconductor devices are mounted on both sides of the substrate, it is possible to substantially improve the mounting density.

In addition, since the semiconductor devices are arranged on the substrate in face-to-face relation with their active surfaces facing the substrate, the transmission of light to the active surfaces which are vulnerable to light is practically nil, so that there is no occurrence of a malfunctioning due to light. Furthermore, since unnecessary noise can be suppressed, it is possible to control the emission of noise to the outside. Since the semiconductor devices are arranged with their active surfaces facing the substrate in such a manner as to oppose each other, it is possible to control the entrance of moisture through the substrate, so that reliability of the semiconductor devices can be improved.

Additionally, since the semiconductor devices can be simultaneously connected to the opposite sides of the substrate using at least a pair of upper and lower bonding tools, the present invention offers a large advantage in that the time required for bonding can be reduced substantially.

This application relates to subject matter disclosed in Japanese Patent Application Nos. 65879/89, filed Mar. 2, 1989, and 303152/89, filed Nov. 24, 1989, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims ar therefore intended to be embraced therein.

What is claimed is:

1. A semiconductor circuit assembly comprising:
   an insulating substrate having front and rear major surfaces said substrate defining a device support region and having conductors arranged in a connecting pattern on both surfaces of said substrate in said device support region, said substrate being provided with a through hole which is located in said device support region and extends completely through said substrate between said front and rear major surfaces; a plurality of semiconductor devices each composed of a semiconductor circuit chip having a plurality of electrodes, and a plurality of conductive fingers each connected to a respective electrode, each said semiconductor device being mounted on a respective major surface of said substrate with said fingers conductively connected to said conductors, and two of said devices being located in said device support region and extending across said through hole; and sealing means enclosing said fingers and sealing each said device to said substrate, said sealing means comprising a mass of sealing material which covers both surfaces of said substrate and extends through said through hole so that the sealing material which covers one said surface of said substrate is connected to the sealing material which covers the other said surface of said substrate by the sealing material which extends through said through hole, wherein said semiconductor devices are mounted on both major surfaces of said substrate so that each semiconductor device on one surface of said substrate is directly opposite a respective semiconductor device on the other surface of said substrate.

2. A circuit assembly as defined in claim 1 wherein: said substrate has a length dimension and a width dimension which is smaller than its said length dimension; each said semiconductor device has a length dimension and a width dimension which is smaller than its said length dimension; and said semiconductor devices are mounted on both surfaces of said substrate such that the length dimensions of all of said semiconductor devices extend in the same direction.

3. A circuit assembly as defined in claim 2 wherein said semiconductor devices are disposed in a plurality of parallel rows on said substrate.

4. A circuit assembly as defined in claim 3 wherein the length dimensions of said semiconductor devices are parallel tot he length dimension of said substrate and, each row of semiconductor devices extends along the length dimension of said substrate, and said semiconductor devices in one row are offset, in the direction of the length dimension of said substrate, from said semiconductor devices in an adjacent row.

5. A circuit assembly as defined in claim 3 wherein the length dimensions of said semiconductor devices are parallel to the width dimension of said substrate.

* * * * *